US 8,680,478 B2

(12) United States Patent
Ofuji et al.

(10) Patent No.: US 8,680,478 B2
(45) Date of Patent: Mar. 25, 2014

(54) RADIATION DETECTION APPARATUS AND DETECTION SYSTEM INCLUDING SAME

(75) Inventors: Masato Ofuji, Honjo (JP); Chiori Mochizuki, Sagamihara (JP); Minoru Watanabe, Honjo (JP); Keigo Yokoyama, Honjo (JP); Jun Kawanabe, Kodama-gun (JP); Kentaro Fujiyoshi, Kumagaya (JP); Hiroshi Wayama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 29 days.

(21) Appl. No.: 13/544,105

(22) Filed: Jul. 9, 2012

(65) Prior Publication Data
US 2013/0020494 A1    Jan. 24, 2013

(30) Foreign Application Priority Data
Jul. 20, 2011    (JP) .................................. 2011-159011

(51) Int. Cl.
*G01J 1/42*    (2006.01)
*G01T 1/00*    (2006.01)
*H04N 3/14*    (2006.01)
*H04N 5/335*    (2011.01)

(52) U.S. Cl.
USPC .......................... 250/394; 250/336.1; 348/300

(58) Field of Classification Search
USPC ................. 250/394, 336.1; 348/300
See application file for complete search history.

(56) References Cited

U.S. PATENT DOCUMENTS

| 2009/0231478 | A1* | 9/2009 | Shinohara ...................... 348/300 |
| 2010/0265350 | A1* | 10/2010 | Ogasawara et al. ........ 348/222.1 |
| 2011/0001860 | A1* | 1/2011 | Taruki et al. .................. 348/300 |

OTHER PUBLICATIONS

Oh et al.,"15.2: 2.0 inch a-Si:H TFT-LCD with Low Noise Integrated Gate Driver" SID 05 Digest, pp. 942-945.

* cited by examiner

*Primary Examiner* — David Porta
*Assistant Examiner* — Abra Fein
(74) *Attorney, Agent, or Firm* — Canon USA Inc. IP Division (57) ABSTRACT

A detection apparatus includes a driving circuit unit in which a plurality of unit circuits each including a first circuit that supplies conducting voltage of a switch element of a pixel based on voltage included in a clock signal to a driving wire in accordance with an initiation signal and a second circuit that supplies non-conducting voltage of the switch element to the driving wire in accordance with a termination signal are provided for the plurality of corresponding driving wires and a control unit that supplies the clock signal to the driving circuit unit. The control unit supplies control voltage to the plurality of unit circuits, and each of the plurality of unit circuits further includes a third circuit that continues to supply the non-conducting voltage to the corresponding driving wire in accordance with the control voltage.

11 Claims, 8 Drawing Sheets

RADIATION DETECTION APPARATUS AND DETECTION SYSTEM INCLUDING SAME

BACKGROUND OF THE INVENTION

1. Field of the Invention

The present invention relates to a radiation detection apparatus and a detection system that are applied to medical image diagnostic apparatuses, nondestructive inspection apparatuses, analytical apparatuses that use radiation, and the like.

2. Description of the Related Art

A technique for manufacturing thin-film semiconductors is utilized in the manufacture of a detection apparatus including an array of pixels (pixel array). Notably, in a radiation detection apparatus, switch elements such as thin-film transistors (TFTs) and conversion elements such as photoelectric conversion elements are combined. In the related art, it is known, for example, that a substrate having a size of 43×43 cm on which pixels are arranged in an array at a pitch of 150 to 200 µm has been used to manufacture a radiation detection apparatus. In a conventional radiation detection apparatus, a driving circuit drives the pixel array in units of rows through driving wires, and a read circuit outputs signals from the pixel array driven in units of rows parallel to one another through signal wires as serial signals. The driving and read circuits are typically prepared in an integrated circuit composed of monocrystalline silicon, and subsequently mounted onto the substrate using chip-on-glass (CoG) technology to configure the detection apparatus.

In such a detection apparatus, currently, the pitch of the pixels is desired to be smaller while the size of the substrate in the related art remains the same. More specifically, a pixel array having a pitch of 50 to 80 µm is expected. Therefore, it would be difficult to mount, using chip-on-glass technology, the driving circuit prepared in the integrated circuit composed of monocrystalline silicon on the substrate on which the pixel array is provided. In addition to the reduction of the pitch of the pixels, a system-on-panel technology is expected in which the driving circuit and the like are formed integrally on the substrate as a unit using a TFT process, in order to reduce the number of components used, and to increase the area of the substrate occupied by the pixel array.

On the other hand, in a liquid crystal display apparatus using TFTs, the system-on-panel technology is being developed in which the driving circuit and the like are formed on the substrate as a unit using a TFT process. J. H. Oh et al, in an article entitled "2.0 inch a-Si:H TFT-LCD with low noise integrated gate driver", Proceedings of Soc. Info. Disp., 2005, 942-945, discloses a driving circuit in which a plurality of stages of unit circuits are formed on a substrate as a unit using a TFT process and prepared in units of rows of pixels while corresponding to driving wires. Each unit circuit includes an output unit, a first input unit, a second input unit, a third input unit, and a fourth input unit. Here, the first input unit is a portion to which a start signal or an output signal of a unit circuit in the previous stage is input, and the output unit is a portion connected to a driving wire to supply an output signal including conducting voltage and non-conducting voltage of a switch element to the driving wire. The second input unit is a portion to which a clock signal is input, the third input unit is a portion to which the non-conducting voltage of the switch element is input, and the fourth input unit is a portion to which a reset signal or an output signal of a unit circuit in the next stage is input. Each unit circuit also includes a first capacitor, one end of which is connected to the output unit, a first thin-film transistor connected between the first input unit and another end of the first capacitor in series with the first capacitor, and a second thin-film transistor provided between the second input unit and the output unit. Either a source or a drain and a gate of the first thin-film transistor are connected to the first input unit, and the other of the source and the drain of the first thin-film transistor is connected to the other end of the first capacitor at a first node P. A gate of the second thin-film transistor is connected to the first node P, either a source or a drain of the second thin-film transistor is connected to the second input unit, and the other of the source and the drain of the second thin-film transistor is connected to the output unit. Each unit circuit also includes a third thin-film transistor connected between the third input unit and the other end of the first capacitor in series with the first capacitor and a fourth thin-film transistor provided between the third input unit and the output unit. A gate of the third thin-film transistor is connected to a second node Q, either a source or a drain of the third thin-film transistor is connected to the third input unit, and the other of the source and the drain of the third thin-film transistor is connected to the other end of the first capacitor at the first node P. A gate of the fourth thin-film transistor is connected to the second node Q, either a source or a drain of the fourth thin-film transistor is connected to the third input unit, and the other of the source and the drain of the fourth-thin film transistor is connected to the output unit. Each unit circuit also includes a second capacitor provided between the third input unit and the gate of the fourth thin-film transistor.

Furthermore, each unit circuit includes a fifth thin-film transistor provided between the fourth input unit and the gates of the second and fourth thin-film transistors and a sixth thin-film transistor provided parallel to the second capacitor. One end of the second capacitor is connected to the third input unit, and another end of the second capacitor is connected to the gate of the fourth thin-film transistor at the second node Q. Either a source or a drain and a gate of the fifth thin-film transistor are connected to the fourth input unit, and the other of the source and the drain of the fifth thin-film transistor is connected to the second node Q. A gate of the sixth thin-film transistor is connected to the first input unit, either a source or a drain of the sixth thin-film transistor is connected to the third input unit, and the other of the source and the drain of the sixth thin-film transistor is connected to the second node Q. Here, the threshold voltage of each of the first to sixth thin-film transistors is denoted by Vth, the maximum and minimum values of voltage of signals input to the components of the unit circuit other than the third input unit are denoted by $V_{DD}$ and $V_{SS}$, respectively. The non-conducting voltage supplied to the second input unit is also denoted by $V_{SS}$. When selected, this unit circuit can execute a so-called bootstrap operation, in which the maximum value of voltage of the clock signal input to the second input unit, namely $V_{DD}$, is output by the first and second thin-film transistors and the first capacitor. In addition, when this unit circuit has not been selected, the unit circuit can output the non-conducting voltage using the fifth and sixth thin-film transistors and the second capacitor. That is, when the unit circuit has been selected, the first and second thin-film transistors and the first capacitor serve as a circuit that supplies the maximum value of voltage of the clock signal input to the second input unit, namely $V_{DD}$, to the output unit as the conducting voltage of the switch element of a pixel. When the unit circuit has not been selected, the third to sixth thin-film transistors and the second capacitor serve as a circuit that supplies the non-conducting voltage $V_{SS}$ to the output unit.

Because there is leakage current (channel leakage) in a thin-film transistor, there is a problem in keeping the non-conducting voltage unchanged (constant) when the unit circuit has not been selected. This is because, when there is channel leakage in the fifth and sixth thin-film transistors, the potential of the second node Q gradually decreases and, after an extended period of time elapses, it becomes difficult to supply voltage higher than Vth to the gate of the fourth thin-film transistor. In such a case, because the fourth thin-film transistor becomes non-conductive, the voltage $V_{SS}$ cannot be supplied to the output unit of the unit circuit, thereby causing the output unit of the unit circuit to float. Specifically, as used herein, a circuit is said to "float" when the circuit is not grounded and stays at some potential other than a ground reference potential; that is, the conductor(s) of the circuit are isolated from ground. A floating circuit can have safety issues because there is no low-impedance path to ground. However, this type of circuit can also help isolate a system from interference problems, for example. The second input unit and the output unit directly form capacitive coupling due to gate-to-drain capacitance Cgd or gate-to-source capacitance Cgs and the parasitic capacitance of a region in which a wire that supplies the clock signal and a driving wire intersects. Therefore, when the output unit of the unit circuit floats, variation in the potential of the clock signal input to the second input unit affects the driving wire, thereby causing the potential of the driving wire to vary. The driving wire has parasitic capacitance in the region in which the driving wire intersects with the signal wire, and the variation in the potential of the driving wire affects the potential of the signal wire through the parasitic capacitance, thereby mixing the variation in the potential of the driving wire into a signal output from a pixel through the signal wire. Therefore, a noise component caused by the variation in the potential of the driving wire becomes large in the signal output from the pixel through the signal wire, and accordingly the signal-to-noise ratio (S/N) of a signal obtained from the detection apparatus can undesirably decrease.

SUMMARY OF THE INVENTION

Therefore, the present invention provides a detection apparatus in which a driving circuit is formed on a substrate as a unit using a TFT process and that can suppress a decrease in the S/N ratio caused by variation in the potential of a driving wire.

A detection apparatus according to an aspect of the present invention includes a pixel array in which a plurality of pixels arranged in a matrix of rows and columns; each pixel including a conversion element that converts radiation or light into electric charge and a switch element that outputs an electrical signal according to the electric charge; a plurality of driving wires, each being connected to the plurality of switch elements arranged in a row direction, a driving circuit unit configured to include a plurality of unit circuits provided for the plurality of corresponding driving wires configured to supply conducting voltage and non-conducting voltage of the switch elements to the plurality of corresponding driving wires, and a control unit configured to supply, to the driving circuit unit, a clock signal for defining timing at which the driving circuit unit supplies the conducting voltage to the driving wires. The conducting voltage is voltage based on the clock signal. The control unit supplies, to the plurality of unit circuits, control voltage for continuing to supply the non-conducting voltage to the driving wires. Each of the plurality of unit circuits includes a first circuit to which the clock signal, an initiation signal for causing the unit circuit to begin to supply the conducting voltage to the corresponding driving wire, and a termination signal for causing the unit circuit to stop supplying the conducting voltage to the corresponding driving wire are input and that supplies the conducting voltage to the corresponding driving wire in accordance with the initiation signal input to the unit circuit, a second circuit that supplies the non-conducting voltage input to the unit circuit to the corresponding driving wire in accordance with the termination signal input to the unit circuit, and a third circuit that continues to supply the non-conducting voltage to the corresponding driving wire in accordance with the control voltage input to the unit circuit.

According to the aspect of the present invention, it is possible to provide a detection apparatus in which a driving circuit is formed on a substrate as a unit using a TFT process and that can suppress a decrease in the S/N ratio caused by variation in the potential of a driving wire.

Further features of the present invention will become apparent from the following description of exemplary embodiments with reference to the attached drawings.

DESCRIPTION OF THE EMBODIMENTS

Variation in the potential of driving wires is a new challenge that can be posed by a detection apparatus. In the case of a display apparatus whose frame period is 1/30 to 1/60 second, the period of time for which non-conducting voltage needs to be remain unchanged (constant) when a unit circuit has not been selected is short, namely 1/30 to 1/60 second, and therefore it is unlikely that an output unit of the unit circuit floats. On the other hand, in the case of a detection apparatus, the period of time for which non-conducting voltage needs to remain unchanged (constant) when a unit circuit has not been selected can be long in a certain operation mode, namely 1 to 3 seconds, and therefore an output unit of the unit circuit can float. Exemplary embodiments of the present invention that solve the challenge posed by the detection apparatus will be described hereinafter with reference to the drawings. It is to be noted that radiation herein includes alpha rays, beta rays, and gamma rays, which are beams configured by particles (include photons) discharged as a result of radioactive decay, as well as beams having visible light, X-rays, particle beams, and cosmic rays, among others.

First Exemplary Embodiment

Figure 1A:
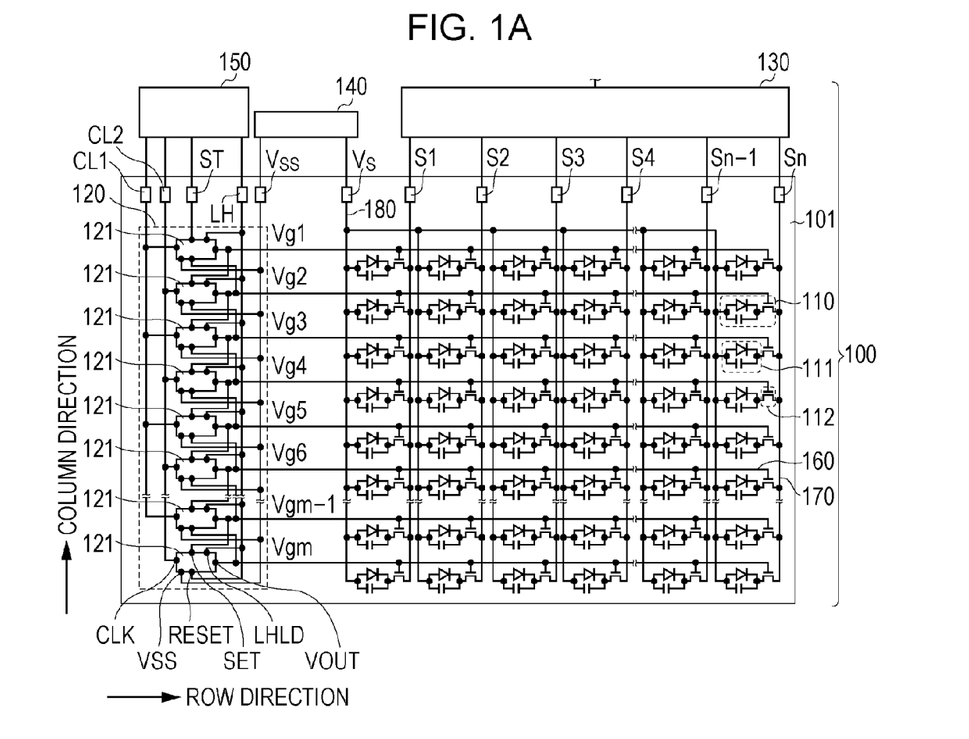
FIG. 1A illustrates a schematic equivalent circuit of a detection apparatus according to a first exemplary embodiment.

First, a detection apparatus according to a first exemplary embodiment of the present invention will be described with reference to FIGS. 1A and 1B. FIG. 1A illustrates a schematic equivalent circuit of the detection apparatus, and FIG. 1B illustrates a schematic equivalent circuit of a unit circuit provided in a driving circuit unit of the detection apparatus.

As illustrated in FIG. 1A, a detection apparatus 100 according to the first exemplary embodiment of the present invention includes a pixel array in which a plurality of pixels 110 are provided on an insulating substrate 101 in a matrix of m rows by n columns. In the present embodiment, the pixel array has m rows and n columns. Each pixel 110 includes a conversion element 111 that converts radiation or light into electric charge and a switch element 112 that outputs an electrical signal according to the converted electric charge. Either a source or a drain of the switch element 112 is electrically connected to a first electrode of the conversion element 111, and a second electrode of the conversion element 111 is electrically connected to an electrode wire 180. The electrode wire 180 is connected to a power supply unit 140 through a connection terminal $V_S$. A signal wire 170 is electrically connected to the other of the source and the drain of the switch element 112. A plurality of (n) signal wires 170 are arranged in a row direction, and each signal wire 170 is connected to the other of the sources and the drains of the plurality of switch elements 112 arranged in a column direction and to an external read circuit unit 130 through one of connection terminals S1 to Sn. A driving wire 160 is electrically connected to a control electrode of each switch element 112. A plurality of (m) driving wires 160 are arranged in the column direction, and each driving wire 160 is connected to gates of the plurality of switch elements 112 arranged in the row direction and to a driving circuit unit 120 provided on the insulating substrate 101. The driving circuit unit 120 is connected to the power supply unit 140 through a connection terminal $V_{SS}$, and to a control unit 150 through connection terminals CL1, CL2, ST, and LH. The power supply unit 140 supplies voltage $V_S$ to be supplied to the conversion elements 111 to the electrode wire 180 and non-conducting voltage $V_{SS}$ of the switch elements 112 to the driving circuit unit 120. The control unit 150 supplies, to the driving circuit unit 120, a start signal ΦST for the driving circuit unit 120 to begin to supply conducting voltage $V_{DD}$ of the switch elements 112 to the driving wires 160. The control unit 150 also supplies clock signals ΦCL1 and ΦCL2 that define the timing of the supply of the conducting voltage $V_{DD}$ and the non-conducting voltage $V_{SS}$ to the driving circuit unit 120. The control unit 150 also supplies, to the driving circuit unit 120, a reset signal for terminating the supply of the conducting voltage $V_{DD}$ to the driving wire 160 and a control signal ΦLH for continuing to supply the non-conducting voltage $V_{SS}$ to the driving wire 160. In the present embodiment, the control signal ΦLH also serves as the reset signal.

The driving circuit unit 120 includes a unit circuit 121, which is provided on the insulating substrate 101, for each driving wire 160. As a whole, the driving circuit unit 120 includes a plurality of (m) unit circuits 121 corresponding to the plurality of driving wires 160. Each unit circuit 121 supplies an output signal Vg including the conducting voltage $V_{DD}$ and the non-conducting voltage $V_{SS}$ to each driving wire 160.

Figure 1B:
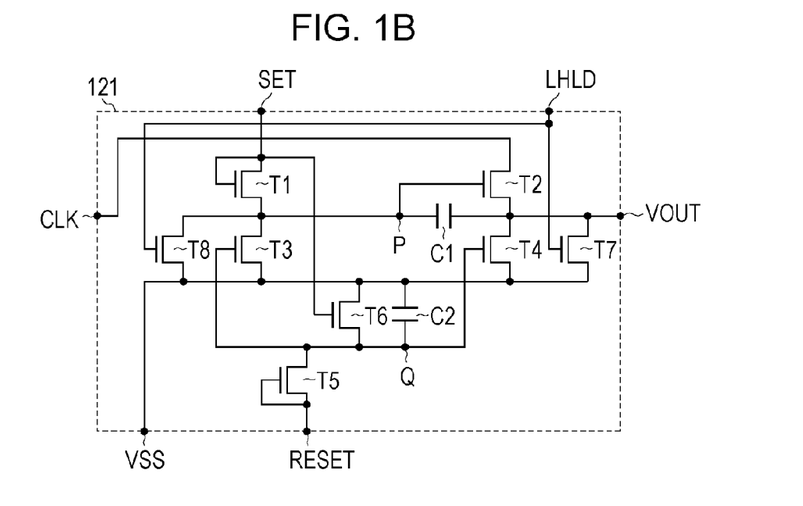
FIG. 1B is a diagram illustrating a schematic equivalent circuit of a unit circuit provided in a driving circuit unit of the detection apparatus according to the first exemplary embodiment.

As illustrated in FIG. 1B, each unit circuit 121 includes an output unit VOUT, a first input unit SET, a second input unit CLK, a third input unit VSS, a fourth input unit RESET, and a fifth input unit LHLD. The first input unit SET is a portion to which the start signal ΦST or the output signal Vg of a previous unit circuit 121 is input, and the output unit VOUT is a portion connected to the driving wire 160 to supply the output signal Vg to the driving wire 160. The start signal ΦST and the output signal Vg of the previous unit circuit 121 herein are defined as initiation signals input to the unit circuit 121 to begin to supply the conducting voltage $V_{DD}$ of the switch element 112. The second input unit CLK is a portion to which the clock signal ΦCL1 or ΦCL2 is input, and the third input unit VSS is a portion to which the non-conducting voltage $V_{SS}$ is input. The fourth input unit RESET is a portion to which the reset signal or the output signals Vg of a next unit circuit 121 is input, and the fifth input unit LHLD is a portion to which the control signal ΦLH is input. The reset signal and the output signal Vg of the next unit circuit 121 herein are defined as termination signals input to the unit circuit 121 to stop supplying the conducting voltage $V_{DD}$ of the switch element 112.

The unit circuit 121 includes first, second, and third circuits.

The first circuit includes a first thin-film transistor T1, a second thin-film transistor T2, and a first capacitor C1. The first circuit is a circuit that supplies the conducting voltage $V_{DD}$ to the output unit VOUT on the basis of a maximum value $V_{DD}$ of the clock signal ΦCL input to the second input unit CLK when a certain unit circuit 121 has been selected. One end of the first capacitor C1 is connected to the output unit VOUT. The first thin-film transistor T1 is connected between the first input unit SET and another end of the first capacitor C1 in series with the first capacitor C1. Either a source or a drain and a gate of the first thin-film transistor T1 are connected to the first input unit SET, and the other of the source and the drain of the first thin-film transistor T1 is connected to the other end of the first capacitor C1 at a first node P. The second thin-film transistor T2 is provided between the second input unit CLK and the output unit VOUT. A gate of the second thin-film transistor T2 is connected to the first node P. Either a source or a drain of the second thin-film transistor T2 is connected to the second input unit CLK, and the other of the source and the drain of the second thin-film transistor T2 is connected to the output unit VOUT.

The second circuit includes a third thin-film transistor T3, a fourth thin-film transistor T4, a second capacitor C2, a fifth thin-film transistor T5, and a sixth thin-film transistor T6. The second circuit is a circuit that supplies the non-conducting voltage $V_{SS}$ to the driving wire 160 in accordance with the reset signal or the output signal Vg of the next unit circuit 121 to stop supplying the conducting voltage $V_{DD}$ to the driving wire 160. The third thin-film transistor T3 is connected between the third input unit VSS and the other end of the first capacitor C1 in series with the first capacitor C1. A gate of the third thin-film transistor T3 is connected to the fourth input unit RESET. Either a source or a drain of the third thin-film transistor T3 is connected to the third input unit VSS, and the other of the source and the drain of the third thin-film transistor T3 is connected to the other end of the first capacitor C1 at the first node P. The fourth thin-film transistor T4 is provided between the third input unit VSS and the output unit VOUT. A gate of the fourth thin-film transistor T4 is connected to the fourth input unit RESET. Either a source or a drain of the fourth thin-film transistor T4 is connected to the third input unit VSS, and the other of the source and the drain of the fourth thin-film transistor T4 is connected to the output unit VOUT. The second capacitor C2 is provided between the third input unit VSS and the gate of the fourth thin-film transistor T4. One end of the second capacitor C2 is connected to the third input unit VSS, and another end of the second capacitor C2 is connected to the gate of the fourth thin-film transistor T4 at a second node Q. The fifth thin-film transistor T5 is provided between the fourth input unit RESET and both the gate of the third thin-film transistor T3 and the gate of the fourth thin-film transistor T4. Either a source or a drain and a gate of the fifth thin-film transistor T5 are connected to the fourth input unit RESET, and the other of the source and the drain of the fifth thin-film transistor T5 is connected to the second node Q. The sixth thin-film transistor T6 is provided parallel to the second capacitor C2. A gate of the sixth thin-film transistor T6 is connected to the first input unit SET. Either a source or a drain of the sixth thin-film transistor T6 is connected to the third input unit VSS, and the other of the source and the drain of the sixth thin-film transistor T6 is connected to the second node Q.

The third circuit includes at least a seventh thin-film transistor T7. The third circuit is a circuit that continues to supply the non-conducting voltage $V_{SS}$ to the driving wire 160 in accordance with the voltage $V_{DD}$ of the control signal ΦLH. The voltage $V_{DD}$ of the control signal ΦLH herein will be referred to as "control voltage" herein. The seventh thin-film transistor T7 is provided between the third input unit VSS, the fifth input unit LHLD, and the output unit VOUT, in order to continue to supply the non-conducting voltage $V_{SS}$ to the output unit VOUT in accordance with the voltage $V_{DD}$ of the control signal ΦLH. A gate of the seventh thin-film transistor T7 is connected to the fifth input unit LHLD. Either a source or a drain of the seventh thin-film transistor T7 is connected to the third input unit VSS, and the other of the source and the drain of the seventh thin-film transistor T7 is connected to the output unit VOUT. When the control unit 150 supplies the voltage $V_{DD}$ of the control signal ΦLH to the seventh thin-film transistors T7 of the plurality of the unit circuits 121, the supply of the non-conducting voltage $V_{SS}$ to the driving wires 160 connected to the unit circuits 121 to which the voltage $V_{DD}$ is supplied is continued. The third circuit according to the present embodiment includes an eighth thin-film transistor T8 in addition to the seventh thin-film transistor T7. The eighth thin-film transistor is provided between the third input unit VSS, the fifth input unit LHLD, and the first node P, in order to keep the first node P at the non-conducting voltage $V_{SS}$ in accordance with the control signal ΦLH. A gate of the eighth thin-film transistor T8 is connected to the fifth input unit LHLD. Either a source or a drain of the eighth thin-film transistor T8 is connected to the third input unit VSS, and the other of the source and the drain of the eighth thin-film transistors T8 is connected to the first node P. When the control unit 150 supplies the voltage $V_{DD}$ of the control signal ΦLH to the eighth thin-film transistor T8 of the plurality of the unit circuits 121, the supply of the non-conducting voltage $V_{SS}$ to the first nodes P of the unit circuits 121 to which the voltage $V_{DD}$ is supplied is continued. Although the voltage $V_{DD}$ of the control signal ΦLH is used as the control voltage in the present embodiment, the present invention is not limited to this. The voltage $V_{SS}$ of the control signal ΦLH may be used instead as the control voltage, and, in that case, a polarity reversing circuit may be provided between the control unit 150 and the fifth input unit LHLD, or any other appropriate design may be applied.

Each thin-film transistor included in the driving circuit unit 120 according to the first exemplary embodiment of the present invention may be composed of an amorphous semiconductor material such as amorphous silicon, a polycrystalline semiconductor material such as polycrystalline silicon, an organic semiconductor material, or an oxide semiconductor material. For example, when a top-gate TFT composed of polycrystalline silicon is used as the switch element 112, a top-gate TFT composed of polycrystalline silicone is desirably also used as the driving circuit unit 120. Even when a bottom-gate TFT composed of amorphous silicon is used as the switch element 112, a top-gate TFT composed of polycrystalline silicon may be used as the driving circuit unit 120.

Figure 2:
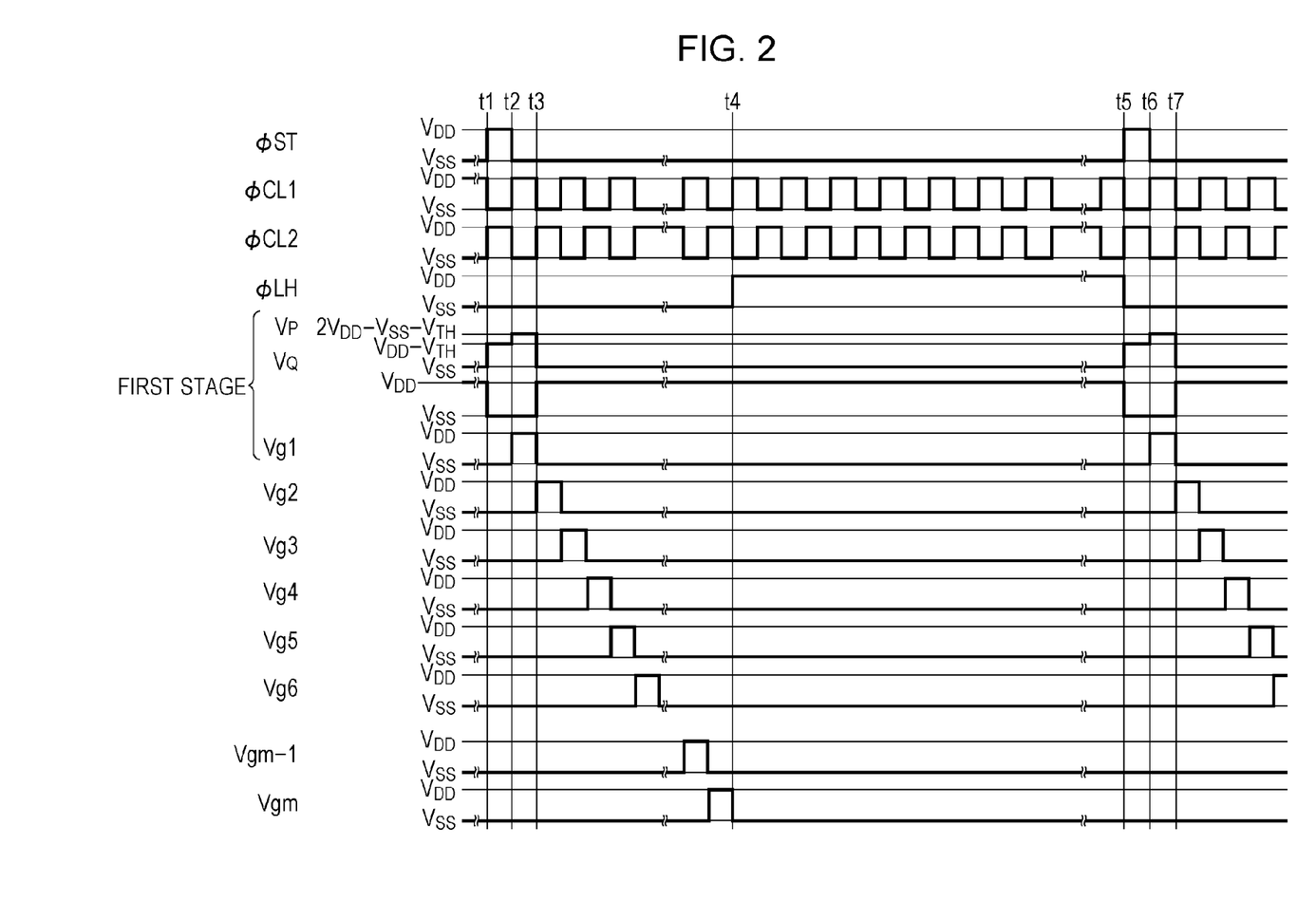
FIG. 2 is a timing chart illustrating the operation of the detection apparatus according to the first exemplary embodiment.

Next, the operation of the detection apparatus illustrated in FIGS. 1A and 1B will be described with reference to a timing chart of FIG. 2. The threshold voltage of the thin-film transistors T1 to T8 is denoted by Vth herein. The maximum and minimum values of voltage of the start signal ΦST, the clock signals ΦCL1 and ΦCL2, and the control signal ΦLH are denoted by $V_{DD}$ and $V_{SS}$, respectively. The phases of the clock signals ΦCL1 and ΦCL2 are different from each other by 180 degrees. The clock signal ΦCL1 is supplied to the unit circuits 121 in the odd rows, and the clock signal ΦCL2 is supplied to the unit circuits 121 in the even rows. The conducting voltage $V_{DD}$, the non-conducting voltage $V_{SS}$, and the threshold voltage Vth are set such that expressions $|V_{DD}-V_{SS}|>Vth$ and $V_{DD}>2Vth$ are satisfied. At a time t1, the voltage $V_{DD}$ of the start signal ΦST is input to supplied to the first input unit SET of a first-stage unit circuit 121, the voltage $V_{SS}$ of the clock signal ΦCL1 is supplied to the second input unit CLK of the first-stage unit circuit 121, and the voltage $V_{SS}$ of the control signal ΦLH is supplied to the fifth input unit LHLD of the first-stage unit circuit 121 from the control unit 150. The voltage $V_{SS}$ is supplied to the third input unit VSS of the first-stage unit circuit 121 from the power supply unit 140, and the voltage $V_{SS}$ is supplied to the fourth input unit RESET of the first-stage unit circuit 121 as an output signal Vg2 of a second-stage unit circuit 121. Therefore, in the first-stage unit circuit 121, the first thin-film transistor T1 and the sixth thin-film transistor T6 become conductive. In the first-stage unit circuit 121, the third thin-film transistor T3, the fourth thin-film transistor T4, the fifth thin-film transistor T5, the seventh thin-film transistor T7, and the eighth thin-film transistor T8 become non-conductive. As a result, in the first-stage unit circuit 121, the potential of the first node P becomes $|V_{DD}-Vth|$ and the potential of the second node Q becomes $V_{SS}$. Therefore, in the first-stage unit circuit 121, the second thin-film transistor T2 becomes conductive, and the potential of the output unit VOUT becomes $V_{SS}$.

Next, at a time t2, the voltage $V_{SS}$ of the start signal ΦST is supplied to the first input unit SET of the first-stage unit circuit 121, the voltage $V_{DD}$ of the clock signal ΦCL1 is supplied to the second input unit CLK of the first-stage unit circuit 121, and the voltage $V_{SS}$ of the control signal ΦLH is supplied to the fifth input unit LHLD of the first-stage unit circuit 121 from the control unit 150. The voltage $V_{SS}$ is supplied to the third input unit VSS of the first-stage unit circuit 121 from the power supply unit 140, and the voltage $V_{SS}$ of the output signal Vg2 of the second-stage unit circuit 121 is supplied to the fourth input unit RESET of the first-stage unit circuit 121. Therefore, in the first-stage unit circuit 121, the thin-film transistors other than the second thin-film transistor T2 become non-conductive. At this time, since the other of the source and the drain and the gate of the second thin-film transistor T2 are connected to each other through the first capacitor C1, the potential of the first node P becomes $|2V_{DD}-V_{SS}-Vth|$ in the first-stage unit circuit 121. Therefore, in the first-stage unit circuit 121, the potential of the output unit VOUT becomes $V_{DD}$ (bootstrap operation). As a result, the voltage $V_{DD}$ is supplied to the driving wire 160 in the first row from the first-stage unit circuit 121 as an output signal Vg1, and the plurality of switch elements 112 in the first row become conductive. Therefore, electrical signals according to the electric charge of the plurality of conversion elements 111 in the first row are output parallel to one another to the plurality of signal wires 170 arranged in the row direction. On the other hand, the voltage $V_{DD}$ of the output signal Vg1 of the first-stage unit circuit 121 is supplied to the first input unit SET of the second-stage unit circuit 121, the voltage $V_{SS}$ of the clock signal ΦCL2 is supplied to the second input unit CLK of the second-stage unit circuit 121, and the voltage $V_{SS}$ of the control signal ΦLH is supplied to the fifth input unit LHLD of the second-stage unit circuit 121. The voltage $V_{SS}$ is supplied to the third input unit VSS of the second-stage unit circuit 121 from the power supply unit 140, and the voltage $V_{SS}$ of an output signal Vg3 of a third-stage unit circuit 121 is supplied to the fourth input unit RESET of the second-stage unit circuit 121. Therefore, in the second-stage unit circuit 121, as with the first-stage unit circuit 121 at the time t1, the potential of the first node P becomes $|V_{DD}-Vth|$, the potential of the second node Q becomes $V_{SS}$, the second thin-film transistor T2 becomes conductive, and the potential of the output unit VOUT becomes $V_{SS}$.

Next, at a time t3, the voltage $V_{SS}$ of the start signal ΦST is supplied to the first input unit SET of the first-stage unit circuit 121, the voltage $V_{SS}$ of the clock signal ΦCL1 is supplied to the second input unit CLK of the first-stage unit circuit 121, and the voltage $V_{SS}$ of the control signal ΦLH is supplied to the fifth input unit LHLD of the first-stage unit circuit 121 from the control unit 150. The voltage $V_{SS}$ is supplied to the third input unit VSS of the first-stage unit circuit 121 from the power supply unit 140, and the voltage $V_{DD}$ of the output signal Vg2 of the second-stage unit circuit 121, which will be described later, is supplied to the fourth input unit RESET of the first-stage unit circuit 121. Therefore, in the first-stage unit circuit 121, the first thin-film transistor T1, the sixth thin-film transistor T6, the seventh thin-film transistor T7, and the eighth thin-film transistor T8 are non-conductive. In the first-stage unit circuit 121, the fifth thin-film transistor T5 becomes conductive. Therefore, in the first-stage unit circuit 121, the potential of the first node P becomes $V_{SS}$, and the potential of the second node Q becomes $|V_{DD}-Vth|$. As a result, in the first-stage unit circuit 121, the second thin-film transistor T2 becomes non-conductive, the third thin-film transistor T3 and the fourth thin-film transistor T4 become conductive, and the potential of the output unit VOUT becomes $V_{SS}$. On the other hand, the voltage $V_{SS}$ of the output signal Vg1 of the first-stage unit circuit 121 is supplied to the first input unit SET of the second-stage unit circuit 121, the voltage $V_{DD}$ of the clock signal ΦCL2 is supplied to the second input unit CLK of the second-stage unit circuit 121, and the voltage $V_{SS}$ of the control signal ΦLH is supplied to the fifth input unit LHLD of the second-stage unit circuit 121. The voltage $V_{SS}$ is supplied to the third input unit VSS of the second-stage unit circuit 121 from the power supply unit 140, and the voltage $V_{SS}$ of an output signal Vg3 of the third-stage unit circuit 121 is supplied to the fourth input unit RESET of the second-stage unit circuit 121. Therefore, in the second-stage unit circuit 121, as with the first-stage unit circuit 121 at the time t2, the potential of the first node P becomes $|2V_{DD}-V_{SS}-Vth|$, and the potential of the output unit VOUT becomes $V_{DD}$ (bootstrap operation). That is, the second-stage (next stage) unit circuit 121 executes the same operation as the first-stage (previous stage) unit circuit 121 half the period (t3–t2) of the clock signal later than the first-stage (previous stage) unit circuit 121 using the voltage $V_{DD}$ of the output signal Vg1 of the first-stage (previous stage) unit circuit 121 as a trigger. Such an operation is sequentially executed up to the m-th-stage unit circuit 121, and the conducting voltage $V_{DD}$ is sequentially supplied to the plurality of driving wires 160 arranged in the column direction from the driving circuit unit 120.

Next, at a time t4, the voltage $V_{SS}$ of the output signal Vgm−1 of an (m−1)th-stage unit circuit 121 is supplied to the first input unit SET of an m-th-stage unit circuit 121 and the voltage $V_{SS}$ of the clock signal ΦCL1 is supplied to the second input unit CLK of the m-th-stage unit circuit 121 from the control unit 150. The voltage $V_{DD}$ of the control signal ΦLH is supplied to the fourth input unit RESET and the fifth input unit LHLD of the first-stage unit circuit 121 from the control unit 150. The voltage $V_{SS}$ is supplied to the third input unit VSS of the first-stage unit circuit 121 from the power supply unit 140. Therefore, in the m-th-stage unit circuit 121, the first thin-film transistor T1 and the sixth thin-film transistor T6 are non-conductive. In the m-th-stage unit circuit 121, the fifth thin-film transistor T5, the seventh thin-film transistor T7, and the eighth thin-film transistor T8 become conductive. As a result, in the m-th-stage unit circuit 121, the potential of the first node P becomes $V_{SS}$, the potential of the second node Q becomes $|V_{DD}-Vth|$, and the potential of the output unit VOUT becomes $V_{SS}$. Therefore, in the m-th-stage unit circuit 121, the second thin-film transistor T2 becomes non-conductive, the third thin-film transistor T3 and the fourth thin-film transistor T4 become conductive, and the potential of the output unit VOUT becomes $V_{SS}$. The voltage $V_{DD}$ of the control signal ΦLH is supplied to the fifth input units LHLD of the other unit circuits 121 from the control unit 150. Therefore, the seventh thin-film transistors T7 and the eighth thin-film transistors T8 become conductive in the other unit circuits 121. As a result, in the other unit circuits 121, the potential of the first nodes P become $V_{SS}$, and the potential of the output units VOUT become $V_{SS}$.

Next, at a time t5, the control signal ΦLH changes from the voltage $V_{DD}$ to the voltage $V_{SS}$, and the seventh thin-film transistor T7 and the eighth thin-film transistor T8 in each unit circuit 121 become non-conductive. Like at the time t1, the voltage $V_{DD}$ of the start signal ΦST is supplied to the first input unit SET of the first-stage unit circuit 121 and the voltage $V_{SS}$ of the clock signal ΦCL1 is supplied to the second input unit CLK of the first-stage unit circuit 121 from the control unit 150. The voltage $V_{SS}$ is supplied to the third input unit VSS of the first-stage unit circuit 121 from the power supply unit 140, and the voltage $V_{SS}$ is supplied to the fourth input unit RESET of the first-stage unit circuit 121 as the output signal Vg2 of the second-stage unit circuit 121. Therefore, like at the time t1, in the first-stage unit circuit 121, the potential of the first node P becomes $|V_{DD}-Vth|$, and the potential of the second node Q becomes $V_{SS}$. Therefore, in the first-stage unit circuit 121, the second thin-film transistor T2 becomes conductive, and the potential of the output unit VOUT becomes $V_{SS}$. At a time t6, like at the time t2, the potential of the output unit VOUT becomes $V_{DD}$ in the first-stage unit circuit 121, and at a time t7, like at the time t3, the potential of the output unit VOUT becomes $V_{DD}$ in the second-stage unit circuit 121.

Here, the control signal ΦLH is $V_{DD}$ from the time t4 to the time t5, and, meanwhile, the potential of the output units VOUT of all the unit circuits 121 to which the control signal ΦLH is supplied is kept at $V_{SS}$. Therefore, the unit circuits 121 continue to supply the non-conducting voltage $V_{SS}$ to the corresponding driving wires 160 in accordance with the voltage $V_{DD}$ of the control signal ΦLH. If there is channel leakage in the fifth thin-film transistor T5 or the sixth thin-film transistor T6, the supply of the voltage equal to or higher than Vth to the gate of the fourth thin-film transistor T4 might not be possible depending on the elapsed time. Accordingly, the potential of the output unit VOUT cannot be kept at $V_{SS}$ by the fourth thin-film transistor T4. In particular, in the detection apparatus, radiation or light needs to be radiated during a period between the time t4 and the time t5, and it takes 1 to 3 seconds to radiate the radiation or the light in the case of general image capture (still image capture). In the detection apparatus, the switch elements 112 need to be non-conductive at least during this period, and therefore the potential of the output units VOUT needs to be kept at the non-conductive voltage $V_{SS}$ for an extended period of time of 1 to 3 seconds. If an output unit VOUT floats, variation in the potential of the clock signal ΦCL input to the second input unit CLK affects the driving wire 160, and accordingly the potential of the driving wire 160 varies. The variation in the potential of the driving wire 160 affects the potential of the signal wire 170 through the parasitic capacitance of a region in which the driving wire 160 and the signal wire 170 intersect, and therefore the variation in the potential of the driving wire 160 is mixed into a signal output from the corresponding pixel. In the present invention, even when the potential of the output unit VOUT cannot be kept at $V_{SS}$ by the fourth thin-film transistor T4, the supply of the non-conducting voltage $V_{SS}$ to the output unit VOUT can be continued by the seventh thin-film transistor T7, to which the voltage $V_{DD}$ of the control signal ΦLH continues to be supplied. Therefore, a detection apparatus can be provided that can suppress a decrease in the S/N ratio caused by the variation in the potential of the driving wires 160.

Figure 3A:
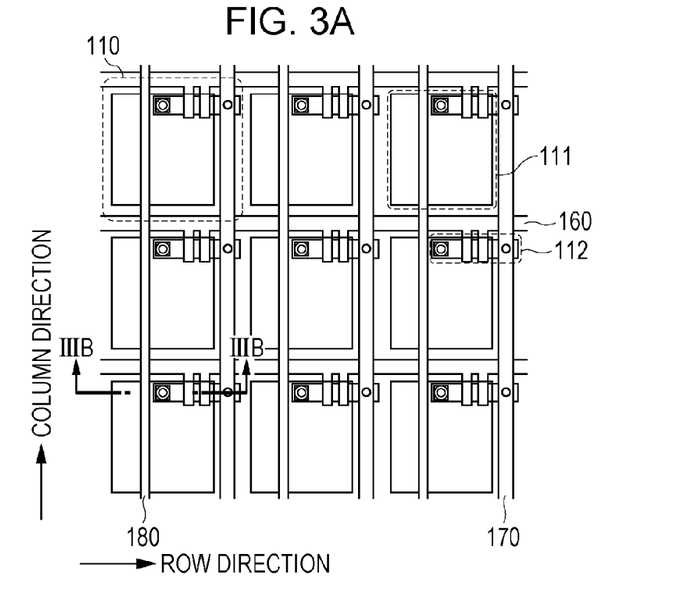
FIG. 3A is a plan view illustrating the configuration of a pixel in the detection apparatus.
Figure 3B:
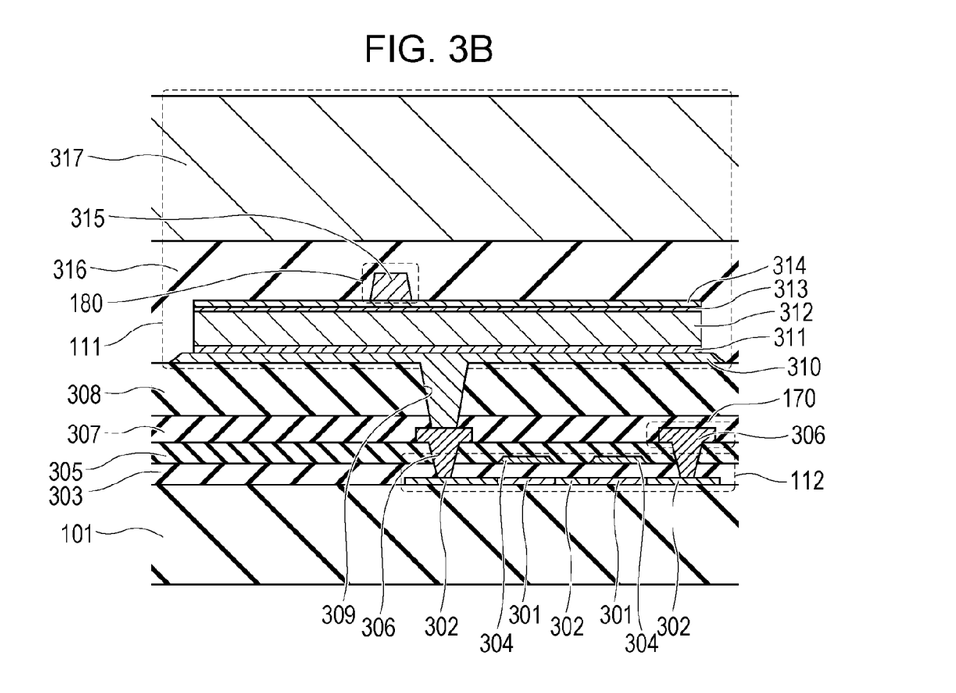
FIG. 3B is a cross-sectional view taken along line IIIB-IIIB illustrated in FIG. 3A.

Next, the configuration of a pixel in the detection apparatus according to the first exemplary embodiment of the present invention will be described with reference to FIGS. 3A and 3B. FIG. 3A is a plan view, and FIG. 3B is a cross-sectional view taken along line IIIB-IIIB illustrated in FIG. 3A.

In the present embodiment, a top-gate, double-gate polycrystalline silicon TFT is used as a switch element 112. Each switch element 112 has a configuration in which a polycrystalline silicon layer including intrinsic semiconductor regions 301 and impurity semiconductor regions 302 of a first conductivity type, a first insulating layer 303, and first conductive layers 304 are stacked in this order from the insulating substrate 101 side. The intrinsic semiconductor regions 301 serve as channels of the TFT, the impurity semiconductor regions 302 serve as a source and a drain, respectively, the first insulating layer 303 serves as a gate insulating layer, and the first conductive layers 304 serve as a gate and the driving wire 160, respectively. The switch element 112 is covered by a second insulating layer 305. The second insulating layer 305 serves as a passivation layer of the switch element 112. Second conductive layers 306 provided on the second insulating layer 305 are connected to the impurity semiconductor regions 302 through contact holes provided in the second insulating layer 305 and the first insulating layer 303. One of the second conductive layers 306 connected to the impurity semiconductor region 302 that serves either the source or the drain serves as a connection terminal to the conversion element 111, and the other second conductive layer 306 connected to the impurity semiconductor region 302 that serves as the other of the source and the drain serves as the signal wire 170. The second conductive layer 306 is covered by a third insulating layer 307. The third insulating layer 307 serves as a passivation layer of the switch element 112 and the signal wire 170. The third insulating layer 307 is covered by a fourth insulating layer 308. The fourth insulating layer 308 is composed of an organic insulating material, and serves as a planarizing layer when configured to have a large thickness. The conversion element 111 is provided on the fourth insulating layer 308. In the present embodiment, as the conversion element 111, an element including a scintillator 317 that converts radiation into light and a photoelectric conversion element that converts the light into electric charge is used. The photoelectric conversion element has a configuration in which a third conductive layer 310, an impurity semiconductor layer 311 of a first conductivity type, an intrinsic semiconductor layer 312, an impurity semiconductor layer 313 of a second conductivity type, and a fourth conductive layer 314 are stacked in this order from the insulating substrate 101 side. The third conductive layer 310 serves as a first electrode of the conversion element 111 and is connected to the second conductive layer 306 through a contact hole 309 provided in the third insulating layer 307 and the fourth insulating layer 308. Amorphous silicon is used for the impurity semiconductor layer 311 of the first conductivity type, the intrinsic semiconductor layer 312, and the impurity semiconductor layer 313 of the second conductivity type. The fourth insulating layer 314 serves as a second electrode of the conversion element 111 and is connected to a fifth conductive layer 315 that serves as the electrode wire 180. The photoelectric conversion element and the electrode wire 180 are covered by the fifth insulating layer 316, and the scintillator 317 is provided on the fifth insulating layer 316.

Although an indirect conversion element including a scintillator that converts radiation into light and a photoelectric conversion element that converts the light into electric charge is used as the conversion element 111 in the present embodiment, the present invention is not limited to this. As the conversion element 111, a direct conversion element that directly converts radiation into electric charge may be used instead. In addition, although a polycrystalline silicon TFT is used as the switch element 112, the present invention is not limited to this. An amorphous silicon TFT, an oxide TFT using an oxide semiconductor, or an organic TFT using an organic semiconductor may be used instead. Although silicon is used as a semiconductor material here, the present invention is not limited to this. Another semiconductor material such as germanium may be used instead.

Figure 4:
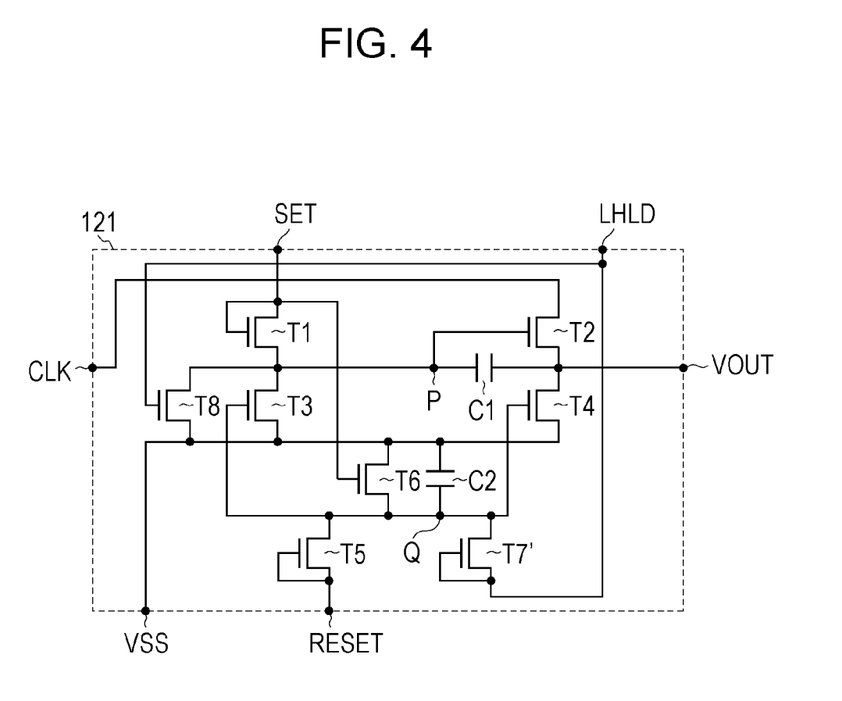
FIG. 4 is a diagram illustrating a schematic equivalent circuit of another example of the unit circuit according to the first exemplary embodiment.

In the present embodiment, the seventh thin-film transistor T7 whose gate is connected to the fifth input unit LHLD, source or gate is connected to the third input unit VSS, and the other of the source and the drain is connected to the output unit VOUT is used in the third circuit. However, the present invention is not limited to this. As illustrated in FIG. 4, a seventh thin-film transistor T7' may be used instead of the seventh thin-film transistor T7 illustrated in FIG. 1B. A gate and either a source or a drain of the seventh thin-film transistor T7' are connected to the fifth input unit LHLD, and the other of the source and the drain is connected to the second node Q. Therefore, voltage equal to or higher than Vth continues to be supplied to the gate of the fourth thin-film transistor T4, and accordingly the non-conducting voltage $V_{SS}$ is continued to be supplied to the output unit VOUT by the fourth thin-film transistor T4. That is, in the present embodiment, the fourth thin-film transistor T4 belongs not only to the second circuit but also to the third circuit. Similarly, voltage equal to or higher than Vth continues to be supplied to the gate of the third thin-film transistor T3, and accordingly the non-conducting voltage $V_{SS}$ is continued to be supplied to the first node P by the third thin-film transistor T3. That is, the third thin-film transistor T3 belongs not only to the second circuit but also to the third circuit.

Second Exemplary Embodiment

Figure 5A:
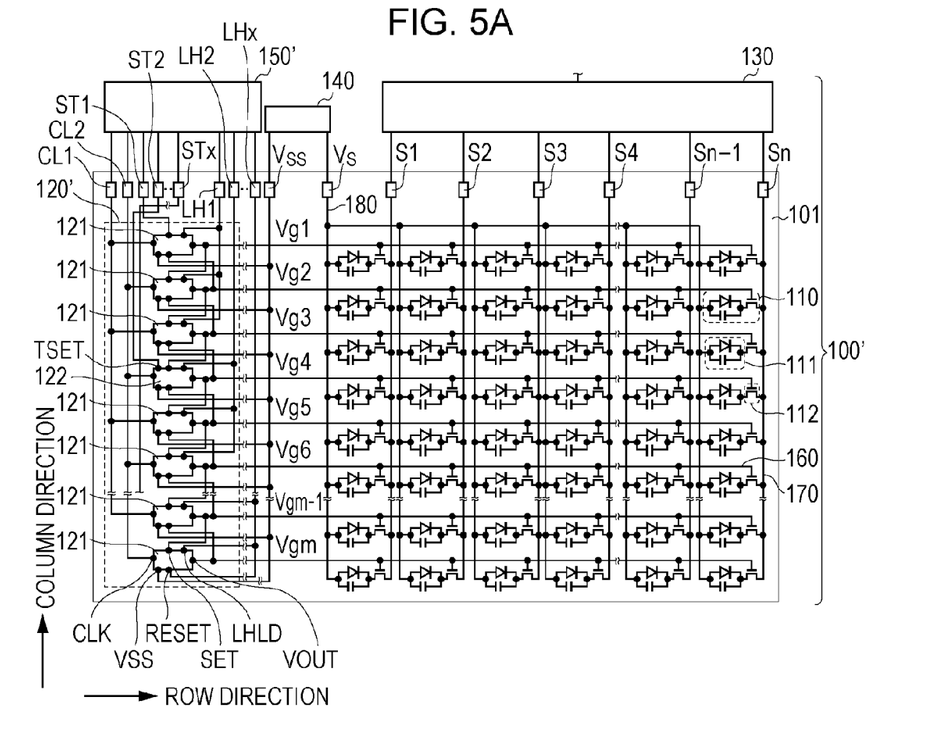
FIG. 5A illustrates a schematic equivalent circuit of a detection apparatus according to a second exemplary embodiment.
Figure 5B:
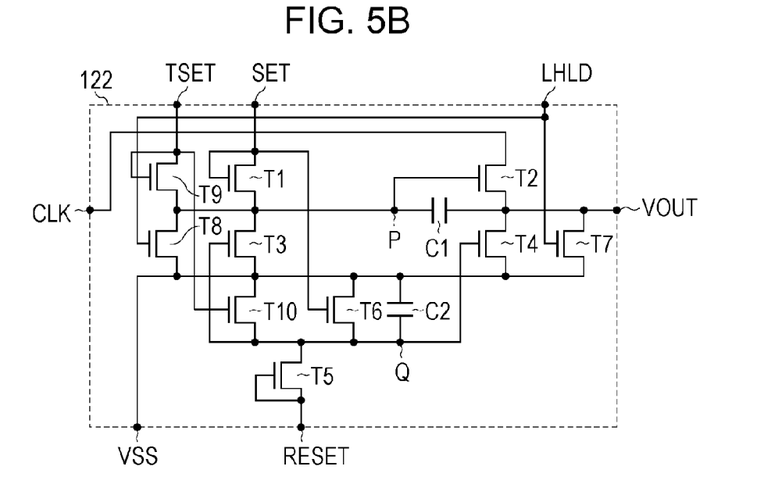
FIG. 5B illustrates a schematic equivalent circuit of a unit circuit provided in a driving circuit unit of the detection apparatus according to the second exemplary embodiment.

Next, a detection apparatus according to a second exemplary embodiment of the present invention will be described with reference to FIGS. 5A and 5B. FIG. 5A illustrates a schematic equivalent circuit of the detection apparatus, and FIG. 5B illustrates a schematic equivalent circuit of a unit circuit provided in a driving circuit unit of the detection apparatus. The same components as those described in the first exemplary embodiment are given the same reference numerals, and therefore detailed description thereof is omitted.

A driving circuit unit 120' according to the present embodiment includes a plurality of unit circuit groups, each including a plurality of unit circuits 121. In FIG. 5A, X unit circuit groups each including three stages of unit circuits are provided. A control unit 150' is configured to be able to independently supply control signals ΦLH1 to ΦLHx to the plurality of unit circuit groups, respectively. Therefore, it is possible to independently control the supply of the non-conducting voltage $V_{SS}$ to the driving wire 160 in each unit circuit group. The control unit 150' is configured to be able to independently supply a start signal ΦST1 and selection signals ΦST2 to ΦSTx to the plurality of unit circuit groups, respectively. Therefore, it is possible to select one of the plurality of unit circuit groups and begins to supply the conducting voltage $V_{DD}$ to the driving wires 160 from the selected unit circuit group. Furthermore, in the present embodiment, instead of the unit circuit 121, a unit circuit 122 illustrated in FIG. 5B is used as an initial-stage unit circuit in each unit circuit group except for the first-stage unit circuit 121. The unit circuit 122 further includes a sixth input unit TSET and a fourth circuit in addition to the components of the unit circuit 121. The fourth circuit is a circuit that causes the first circuit to supply the conducting voltage $V_{DD}$ to the driving wire 160 in accordance with any of the selection signals ΦST2 to ΦSTx, and includes a ninth thin-film transistor T9 and a tenth thin-film transistor T10. The ninth thin-film transistor T9 is connected between the sixth input unit TSET and the other end of the first capacitor C1 in series with the first capacitor C1. Either a source or a drain and a gate of the ninth thin-film transistor T9 are connected to the sixth input unit TSET, and the other of the source and the drain of the ninth thin-film transistor T9 is connected to the first node P. The tenth thin-film transistor T10 is provided parallel to the second capacitor C2 and the sixth thin-film transistor T6. A gate of the tenth thin-film transistor T10 is connected to the sixth input unit TSET, either a source or a drain of the tenth thin-film transistor T10 is connected to the third input unit VSS, and the other of the source and the drain of the tenth thin-film transistor T10 is connected to the second node Q.

Figure 6:
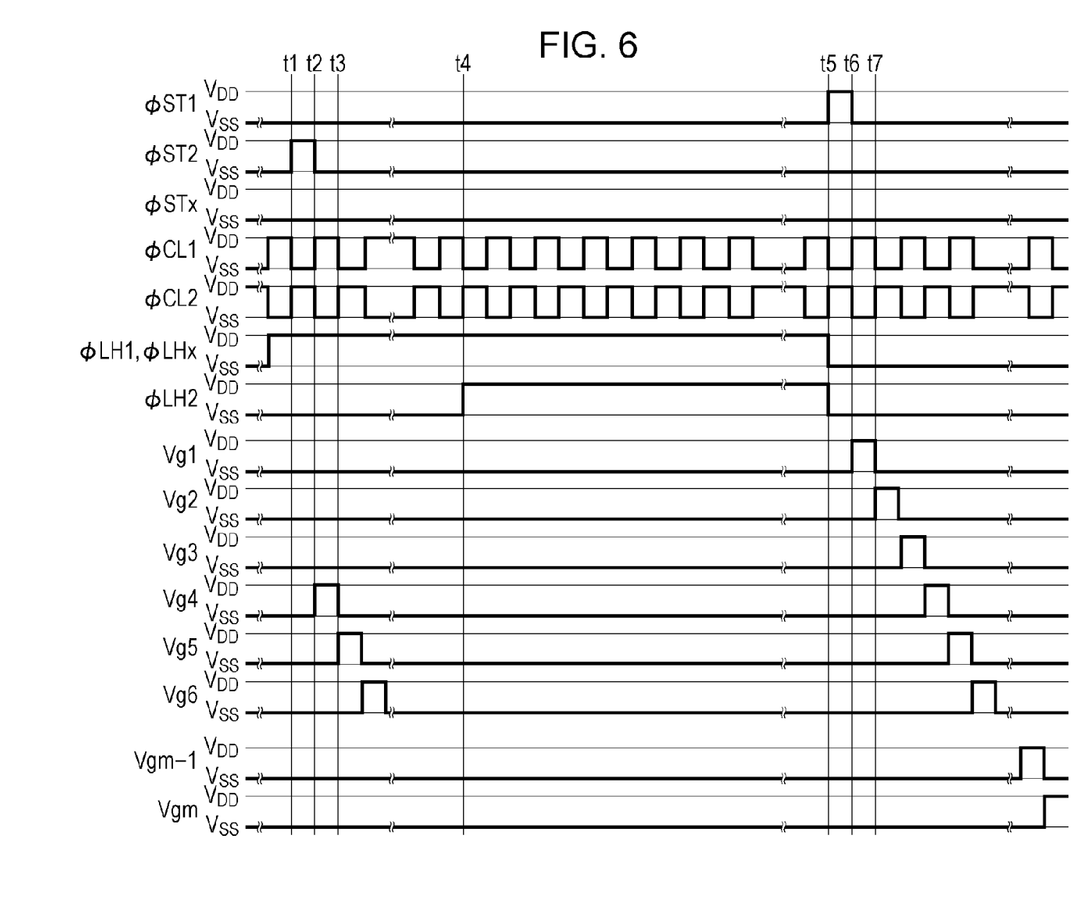
FIG. 6 is a timing chart illustrating the operation of the detection apparatus according to the second exemplary embodiment.

Next, the operation of the detection apparatus illustrated in FIGS. 5A and 5B will be described with reference to a timing chart of FIG. 6. In the following description, an example will be described in which the unit circuits in a first unit circuit group and an X-th unit circuit group are not operated, and the operation begins with an initial-stage (fourth-stage) unit circuit 122 in a second unit circuit group. The same components as those described in the first exemplary embodiment are given the same reference numerals, and therefore detailed description thereof is omitted.

At a time t1, the voltage $V_{SS}$ of the start signal ΦST1 is supplied to the first input unit SET of the first-stage unit circuit 121 and the voltage $V_{SS}$ of the clock signal ΦCL1 is supplied to the second input unit CLK from the control unit 150'. The voltage $V_{DD}$ of the control signal ΦLH1 is supplied to the fifth input units LHLD of all the unit circuits 121 in the first group from the control unit 150'. The voltage $V_{SS}$ of the selection signal ΦSTx is supplied to the first input unit SET of an (m−2)th unit circuit 121, which is the initial-stage unit circuit 121 in the X-th unit circuit group, and the voltage $V_{SS}$ of the clock signal ΦCL1 is supplied to the second input unit CLK of the (m−2)th unit circuit 121 from the control unit 150'. The voltage $V_{DD}$ of the control signal ΦLHx is supplied to the fifth input units LHLD of all the unit circuits 121 and the unit circuit 122 in the X-th unit circuit group from the control unit 150'. Therefore, the potential of the output units VOUT of all the unit circuits 121 and the unit circuit 122 in the first and the X-th unit circuit groups becomes $V_{SS}$. The control signals ΦLH1 and ΦLHx are kept at $V_{DD}$ until a time t5, which will be described later, and the potential of the output units VOUT of all the unit circuits 121 and the unit circuit 122 in the first and the X-th unit circuit groups is kept at $V_{SS}$ until the time t5. That is, the output units VOUT of the unit circuits 121 and the unit circuit 122 in the unit circuit groups (the first and the X-th unit circuit groups) among the plurality of unit circuit groups except for unit circuit groups including the unit circuits 121 connected to the plurality of driving wires 160 to which the conducting voltage is to be selectively supplied are kept at the non-conducting voltage $V_{SS}$. On the other hand, the voltage $V_{SS}$ of the output signal Vg3 of the third-stage unit circuit 121 is supplied to the first input unit SET of the fourth-stage unit circuit 122, which is the initial-stage unit circuit in the second unit circuit group, the voltage $V_{DD}$ of the clock signal ΦCL2 is supplied to the second input unit CLK of the fourth-stage unit circuit 122, and the voltage $V_{SS}$ of the control signal ΦLH is supplied to the fifth input unit LHLD of the fourth-stage unit circuit 122 from the control unit 150'. The voltage $V_{SS}$ is supplied to the third input unit VSS of the fourth-stage unit circuit 122 from the power supply unit 140, and the voltage $V_{SS}$ of an output signal Vg5 of a fifth-stage unit circuit 121 is supplied to the fourth input unit RESET of the fourth-stage unit circuit 122. Furthermore, the voltage $V_{DD}$ of the selection signal ΦST2 is supplied to the sixth input unit TSET of the fourth-stage unit circuit 122. Therefore, in the fourth-stage unit circuit 122, the ninth thin-film transistor T9 and the tenth thin-film transistor T10 become conductive. In the fourth-stage unit circuit 122, the first thin-film transistor T1 to the eighth thin-film transistor T8 become non-conductive. As a result, in the fourth-stage unit circuit 122, the potential of the first node P becomes |$V_{DD}$−Vth|, and the potential of the second node Q becomes $V_{SS}$. Therefore, in the fourth-stage unit circuit 122, the second thin-film transistor T2 becomes conductive, and the potential of the output unit VOUT becomes $V_{SS}$.

Next, at a time t2, the voltage $V_{SS}$ of the output signal Vg3 of the third-stage unit circuit 121 is supplied to the first input unit SET of the fourth-stage unit circuit 122, the voltage $V_{DD}$ of the clock signal ΦCL2 is supplied to the second input unit CLK of the fourth-stage unit circuit 122, and the voltage $V_{SS}$ of the control signal ΦLH2 is supplied to the fifth input unit LHLD of the fourth-stage unit circuit 122 from the control unit 150'. The voltage $V_{SS}$ is supplied to the third input unit VSS of the fourth-stage unit circuit 122 from the power supply unit 140, and the voltage $V_{SS}$ of the output signal Vg2 of the second-stage unit circuit 121 is supplied to the fourth input unit RESET. Furthermore, the voltage $V_{SS}$ of the selection signal ΦST2 is supplied to the sixth input unit TSET from the control unit 150'. Therefore, in the fourth-stage unit circuit 122, the thin-film transistors other than the second thin-film transistor T2 become non-conductive. At this time, since the other of the source and the drain and the gate of the second thin-film transistor T2 are connected to each other through the first capacitor C1, the potential of the first node P becomes |2$V_{DD}$-$V_{SS}$-Vth| in the fourth-stage unit circuit 122. Therefore, in the fourth-stage unit circuit 122, the potential of the output unit VOUT becomes $V_{DD}$ (bootstrap operation). As a result, the voltage $V_{DD}$ is supplied to the driving wire 160 in the fourth row from the fourth-stage unit circuit 122 as an output signal Vg4, and accordingly the plurality of switch elements 112 in the fourth row become conductive. Therefore, electrical signals according to the electric charge of the plurality of conversion elements 111 in the fourth row are output parallel to one another to the plurality of signal wires 170, respectively, arranged in the row direction. On the other hand, the voltage $V_{DD}$ of the output signal Vg4 of the fourth-stage unit circuit 122 is supplied to the first input unit SET of the fifth-stage unit circuit 121, the voltage $V_{SS}$ of the clock signal ΦCL1 is supplied to the second input unit CLK of the fifth-stage unit circuit 121, and the voltage $V_{SS}$ of the control signal ΦLH2 is supplied to the fifth input unit LHLD of the fifth-stage circuit unit 121 from the control unit 150'. The voltage $V_{SS}$ is supplied to the third input unit VSS of the fifth-stage unit circuit 121 from the power supply unit 140, and the voltage $V_{SS}$ of an output signal Vg6 is supplied to the fourth input unit RESET of the fifth-stage unit circuit 121. Therefore, as with the fourth-stage unit circuit 122 at the time t1, in the fifth-stage unit circuit 121, the potential of the first node P becomes |$V_{DD}$-Vth|, the potential of the second node Q becomes $V_{SS}$, the second thin-film transistor T2 becomes conductive, and the potential of the output unit VOUT becomes $V_{SS}$.

Next, at a time t3, the voltage of the output signal Vg3 of the third-stage unit circuit 121 is supplied to the first input unit SET of the fourth-stage unit circuit 122, the voltage $V_{SS}$ of the clock signal ΦCL2 is supplied to the second input unit CLK of the fourth-stage unit circuit 122, and the voltage $V_{SS}$ of the control signal ΦLH2 is supplied to the fifth input unit LHLD from the control unit 150'. The voltage $V_{SS}$ is supplied to the third input unit VSS of the fourth-stage unit circuit 122 from the power supply unit 140, and the voltage $V_{DD}$ of the output signal Vg2 of the fifth-stage unit circuit 121, which will be described later, is supplied to the fourth input unit RESET of the fourth-stage unit circuit 122. Furthermore, the voltage $V_{SS}$ of the selection signal ΦST2 is supplied to the sixth input unit TSET of the fourth-stage unit circuit 122 from the control unit 150'. Therefore, in the fourth-stage unit circuit 122, the first thin-film transistor T1 and the sixth thin-film transistor T6 to the tenth thin-film transistor T10 are non-conductive. In the fourth-stage unit circuit 122, the fifth thin-film transistor T5 becomes conductive. Therefore, in the fourth-stage unit circuit 122, the potential of the first node P becomes $V_{SS}$, and the potential of the second node Q becomes |$V_{DD}$-Vth|. As a result, in the fourth-stage unit circuit 122, the second thin-film transistor T2 becomes non-conductive, the third thin-film transistor T3 and the fourth thin-film transistor T4 become conductive, and the potential of the output unit VOUT becomes $V_{SS}$. On the other hand, the voltage $V_{SS}$ of the output signal Vg4 of the first-stage unit circuit 121 is supplied to the first input unit SET of the fifth-stage unit circuit 121, the voltage $V_{DD}$ of the clock signal ΦCL1 is supplied to the second input unit CLK of the fifth-stage unit circuit 121, and the voltage $V_{SS}$ of the control signal ΦLH2 is supplied to the fifth input unit LHLD of the fifth-stage unit circuit 121 from the control unit 150'. The voltage $V_{SS}$ is supplied to the third input unit VSS of the fifth-stage unit circuit 121 from the power supply unit 140, and the voltage $V_{SS}$ of the output signal Vg6 of the sixth-stage unit circuit 121 is supplied to the fourth input unit RESET of the fifth-stage unit circuit 121. Therefore, as with the fourth-stage unit circuit 122 at the time t2, in the fifth-stage unit circuit 121, the potential of the first node P becomes |2$V_{DD}$-$V_{SS}$-Vth|, and the potential of the output unit VOUT becomes $V_{DD}$ (bootstrap operation). That is, the fifth-stage (next stage) unit circuit 121 executes the same operation as the fourth-stage (previous stage) unit circuit 122 half the period (t3–t2) of the clock signal later than the fourth-stage (previous stage) unit circuit 122 using the voltage $V_{DD}$ of the output signal Vg4 of the fourth-stage (previous stage) unit circuit 122 as a trigger. Such an operation is sequentially executed up to an (m−3)th unit circuit 121, and the conducting voltage $V_{DD}$ is sequentially supplied to the plurality of driving wires 160, which are arranged in the column direction, up to an (m−3)th driving wire 160 from the driving circuit unit 120.

Next, at a time t4, the voltage $V_{DD}$ of the control signal ΦLH2 is supplied to the fifth input units LHLD of all the unit circuits 121 and the unit circuit 122 in the second unit circuit group from the control unit 150'. Therefore, the potential of the output units VOUT of the all the unit circuits 121 and the unit circuit 122 in the second unit circuit group becomes $V_{SS}$. The control signal ΦLH2 is kept at $V_{DD}$ until the time t5, and the potential of the output units VOUT of all the unit circuits 121 and the unit circuit 122 in the second unit circuit group is kept at $V_{SS}$ until the time t5.

The operation at the time t5 and later is the same as that according to the first exemplary embodiment, except that the voltage $V_{SS}$ of the control signals ΦLH2 to ΦLHx is supplied to the fifth input units LHLD of the initial-stage unit circuits 122, respectively, other than the initial-stage unit circuit 121 in the first unit circuit group from the control unit 150'. Therefore, detailed description of the operation is omitted.

Thus, in the present embodiment, it is possible to operate unit circuit groups selected from among the plurality of unit circuit groups. Furthermore, even when unit circuit groups are operated by selecting the unit circuit groups from among the plurality of unit circuit groups, it is possible to provide a detection apparatus that can suppress a decrease in the S/N ratio caused by variation in the potential of the driving wires 160.

Figure 7:
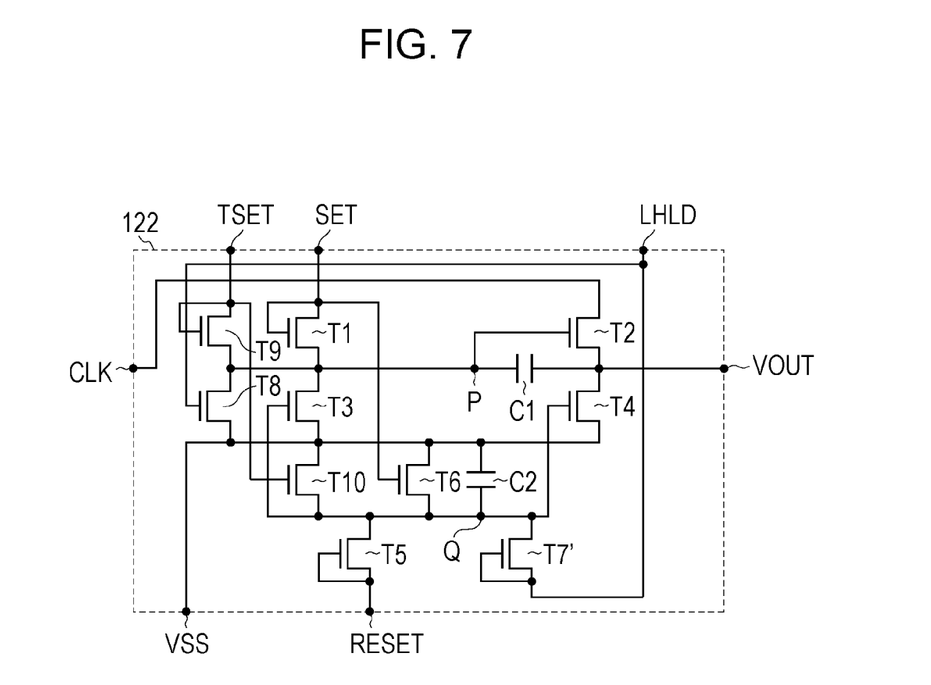
FIG. 7 is a diagram illustrating a schematic equivalent circuit of another example of the unit circuit according to the second exemplary embodiment.

In the present embodiment, the seventh thin-film transistor T7 whose gate is connected to the fifth input unit LHLD, source or drain is connected to the third input unit VSS, and the other of the source and the drain is connected to the output unit VOUT is used in the third circuit. However, as in the first exemplary embodiment, instead of the seventh thin-film transistor T7 illustrated in FIG. 5B, a seventh thin-film transistor T7' may be used as illustrated in FIG. 7.

Applied Exemplary Embodiment

Figure 8:
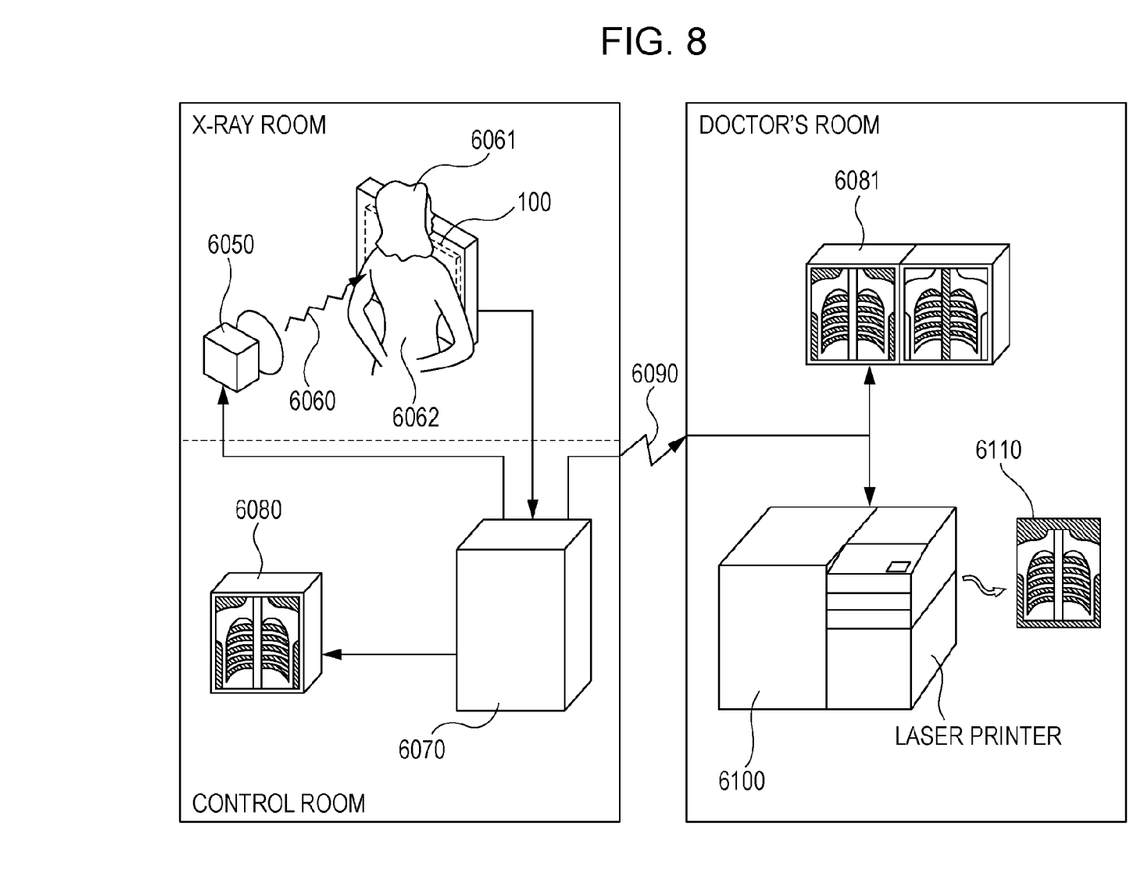
FIG. 8 is a conceptual diagram illustrating a radiation detection system using the detection apparatus in the present invention.

Next, a radiation detection system using the detection apparatus in the present invention will be described with reference to FIG. 8.

An X-ray 6060 generated by an X-ray tube 6050, which is a radiation source, propagates through a chest 6062 of a patient or subject 6061 and is incident on each conversion element of a conversion unit included in a radiation detection apparatus. The incident X-ray includes information regarding the inside of the chest 6062 of the patient 6061. The radiation is converted into electric charge by the conversion unit in accordance with the incident X-ray to obtain electrical information. This information is converted into digital data and then subjected to image processing in an image processor 6070. The information after the image processing can be observed on a display 6080, which serves as a display unit in a control room.

In addition, this information can be transferred to a distant place by a transmission process unit such as a telephone network 6090 to display the information on a display 6081, which serves as a display unit, or to save the information to a recording medium such as an optical disk in a doctor's room or the like located in the distance place, and can be seen by the doctor in the distant place. The information can also be recorded on a film 6110, which serves as a recording medium, by a film processor 6100, which serves as a recording unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-159011 filed Jul. 20, 2011, which is hereby incorporated by reference herein in its entirety.

What is claimed is:

1. A detection apparatus comprising:
a pixel array in which a plurality of pixels are arranged in a matrix of rows and columns, each pixel including a conversion element that converts radiation or light into electric charge and a switch element that outputs an electrical signal according to the electric charge;
a plurality of driving wires, each being connected to a plurality of switch elements arranged in a row direction;
a driving circuit unit configured to include a plurality of unit circuits provided for the plurality of corresponding driving wires configured to supply conducting voltage and non-conducting voltage of the switch elements to the plurality of corresponding driving wires; and
a control unit configured to supply, to the driving circuit unit, a clock signal for defining timing at which the driving circuit unit supplies the conducting voltage to the driving wires,
wherein the conducting voltage is voltage based on the clock signal,
wherein the control unit supplies, to the plurality of unit circuits, a control signal for continuing to supply the non-conducting voltage to the driving wires,
wherein each of the plurality of unit circuits receives the clock signal, an initiation signal for causing the unit circuit to begin to supply the conducting voltage to the corresponding driving wire, and a termination signal for causing the unit circuit to stop supplying the conducting voltage to the corresponding driving wire, and
wherein each of the plurality of unit circuits includes a first circuit that supplies the conducting voltage to the corresponding driving wire in accordance with the initiation signal input to the unit circuit, a second circuit that supplies the non-conducting voltage input to the unit circuit to the corresponding driving wire in accordance with the termination signal input to the unit circuit, and a third circuit that continues to supply the non-conducting voltage to the corresponding driving wire in accordance with the control signal input to the unit circuit.

2. The detection apparatus according to claim 1,
wherein the pixel array is provided on a substrate,
wherein the plurality of driving wires, each of which is connected to the plurality of switch elements arranged on the substrate in the row direction, are provided in a column direction, and
wherein the driving circuit unit is configured by providing the plurality of unit circuits on the substrate.

3. The detection apparatus according to claim 2,
wherein each of the plurality of unit circuits includes an output unit connected to the corresponding driving wire to supply the output signal to the driving wire, a first input unit to which the initiation signal is input, a second input unit to which the clock signal is input, a third input unit to which the non-conducting voltage is input, a fourth input unit to which the termination signal is input, and a fifth input unit to which the control signal is input,
wherein the first circuit includes a first capacitor, one end of which is connected to the output unit, a first thin-film transistor connected between the first input unit and another end of the first capacitor in series with the first capacitor, and a second thin-film transistor provided between the second input unit and the output unit, either a source or a drain and a gate of the first thin-film transistor being connected to the first input unit, the other of the source and the drain of the first thin-film transistor being connected to the other end of the first capacitor at a first node, a gate of the second thin-film transistor being connected to the first node, either a source or a drain of the second thin-film transistor being connected to the second input unit, the other of the source and the drain of the second thin-film transistor being connected to the output unit,
wherein the second circuit includes a third thin-film transistor connected between the third input unit and the other end of the first capacitor in series with the first capacitor, a fourth thin-film transistor provided between the third input unit and the output unit, a second capacitor provided between the third input unit and a gate of the fourth thin-film transistor, a fifth thin-film transistor provided between the fourth input unit and both a gate of the third thin-film transistor and the gate of the fourth thin-film transistor, and a sixth thin-film transistor provided parallel to the second capacitor, the gate of the third thin-film transistor being connected to the fourth input unit, either a source or a drain of the third thin-film transistor being connected to the third input unit, the other of the source and the drain of the third thin-film transistor being connected to the other end of the first capacitor at the first node, the gate of the fourth thin-film transistor being connected to the fourth input unit, either a source or a drain of the fourth thin-film transistor being connected to the third input unit, the other of the source and the drain of the fourth thin-film transistor being connected to the output unit, one end of the second capacitor being connected to the third input unit, another end of the second capacitor being connected to the gate of the fourth thin-film transistor at a second node, either a source or a drain and a gate of the fifth thin-film transistor being connected to the fourth input unit, the other of the source and the drain of the fifth thin-film transistor being connected to the second node, a gate of the sixth thin-film transistor being connected to the first input unit, either a source or a drain of the sixth thin-film transistor being connected to the third input unit, the other of the source and the drain of the sixth thin-film transistor being connected to the second node, and
wherein the third circuit includes a seventh thin-film transistor that keeps the output unit at the non-conducting voltage in accordance with the control signal.

4. The detection apparatus according to claim 3,
wherein a gate of the seventh thin-film transistor is connected to the fifth input unit, either a source or a drain of the seventh thin-film transistor is connected to the third input unit, and the other of the source and the drain of the seventh thin-film transistor is connected to the output unit.

5. The detection apparatus according to claim 3, wherein a gate and either a source or a drain of the seventh thin-film transistor are connected to the fifth input unit and the other of the source and the drain is connected to the second node.

6. The detection apparatus according to claim 3, wherein the third circuit further includes an eighth thin-film transistor that keeps the first node at the non-conducting voltage in accordance with the control signal.

7. The detection apparatus according to claim 3, wherein the driving circuit unit includes a plurality of unit circuit groups, each including the plurality of unit circuits, and wherein the control unit supplies the control signal to each of the plurality of unit circuit groups.

8. The detection apparatus according to claim 7, wherein the control unit supplies, to an initial-stage unit circuit in a unit circuit group selected from among the plurality of unit circuit groups, a selection signal for causing the selected unit circuit group to selectively supply the conducting voltage to the corresponding driving wire, and wherein the initial-stage unit circuit in the selected unit circuit group further includes a fourth circuit that causes the first circuit to supply the conducting voltage to the corresponding driving wire in accordance with the selection signal.

9. The detection apparatus according to claim 8, wherein the initial-stage unit circuit in the selected unit circuit group further includes a sixth input unit to which the selection signal is input, wherein the fourth circuit includes a ninth thin-film transistor connected between the sixth input unit and the other end of the first capacitor in series with the first capacitor, and a tenth thin-film transistor provided parallel to the second capacitor and the sixth thin-film transistor, and wherein either a source or a drain and a gate of the ninth thin-film transistor are connected to the sixth input unit, the other of the source and the drain of the ninth thin-film transistor is connected to the first node, a gate of the tenth thin-film transistor is connected to the sixth input unit, either a source or a drain of the tenth thin-film transistor is connected to the third input unit, and the other of the source and the drain of the tenth thin-film transistor is connected to the second node.

10. The detection apparatus according to claim 8, wherein the control unit supplies the control signal to each of the plurality of unit circuit groups, so that the output units of the unit circuit groups among the plurality of unit circuit groups other than a unit circuit group including unit circuits connected to the plurality of driving wires to which the conducting voltage is to be selectively supplied are kept at the non-conducting voltage.

11. A detection system comprising:
the detection apparatus according to claim 1,
a signal processing unit configured to process a signal from the detection apparatus;
a recording unit configured to record a signal from the signal processing unit;
a display unit configured to display the signal from the signal processing unit; and
a transmission process unit configured to transmit the signal from the signal processing unit.

* * * * *